(12) United States Patent
Kim et al.

(10) Patent No.: US 11,706,950 B2
(45) Date of Patent: Jul. 18, 2023

(54) ORGANIC LIGHT-EMITTING DISPLAY APPARATUS AND METHOD OF MANUFACTURING THE SAME

(71) Applicant: Samsung Display Co., Ltd., Yongin-si (KR)

(72) Inventors: Waljun Kim, Yongin-si (KR); Jinyeong Kim, Yongin-si (KR); Kiwan Ahn, Yongin-si (KR); Joosun Yoon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/450,796

(22) Filed: Jun. 24, 2019

(65) Prior Publication Data

US 2019/0393415 A1    Dec. 26, 2019

(30) Foreign Application Priority Data

Jun. 25, 2018 (KR) ........................ 10-2018-0072994

(51) Int. Cl.
| | |
|---|---|
| *H10K 59/122* | (2023.01) |
| *H10K 59/35* | (2023.01) |
| *H10K 71/00* | (2023.01) |
| *H01L 27/32* | (2006.01) |
| *H01L 51/56* | (2006.01) |

(52) U.S. Cl.
CPC ...... *H01L 27/3246* (2013.01); *H01L 27/3211* (2013.01); *H01L 27/3218* (2013.01); *H01L 51/56* (2013.01); *H01L 2227/323* (2013.01)

(58) Field of Classification Search
CPC .................................................. H01L 27/3246
See application file for complete search history.

(56) References Cited

U.S. PATENT DOCUMENTS

| | | |
|---|---|---|
| 8,350,468 B2 | 1/2013 | Ko et al. |
| 9,466,648 B2 | 10/2016 | Kim |
| 9,627,457 B2 | 4/2017 | Lee |
| 9,704,926 B2 | 7/2017 | Kim |
| 10,347,703 B2 | 7/2019 | Park et al. |

(Continued)

FOREIGN PATENT DOCUMENTS

| | | |
|---|---|---|
| CN | 108010946 | 5/2018 |
| KR | 10-2010-0003243 | 1/2010 |

(Continued)

*Primary Examiner* — Lauren R Bell
(74) *Attorney, Agent, or Firm* — H.C. Park & Associates, PLC

(57) ABSTRACT

An organic light-emitting display apparatus includes a pixel-defining layer configured to surround a plurality of pixels while exposing an emission area of the plurality of pixels on a substrate; and a spacer provided on the pixel-defining layer and configured to allow a mask to be placed on the spacer, the mask being arranged for deposition of an emission layer in the emission area, wherein a distance in a plane direction between the spacer and each of the plurality of pixels is within 1 μm. A color mixture between pixels may be prevented by suppressing the shadow phenomenon in deposition of an emission layer such that performance and reliability of the organic light-emitting display apparatus may be significantly improved.

13 Claims, 4 Drawing Sheets

(56) References Cited

U.S. PATENT DOCUMENTS

| | | | | |
|---|---|---|---|---|
| 2010/0033084 | A1* | 2/2010 | Ko | H01L 27/3246 313/504 |
| 2014/0203303 | A1* | 7/2014 | Jiang | H01L 51/56 257/88 |
| 2014/0319479 | A1* | 10/2014 | Park | H01L 27/3216 257/40 |
| 2015/0102320 | A1 | 4/2015 | Jung | |
| 2015/0162391 | A1* | 6/2015 | Kim | H01L 27/3246 257/40 |
| 2017/0005144 | A1* | 1/2017 | Akagawa | G02B 27/0172 |
| 2019/0096962 | A1* | 3/2019 | Han | H01L 27/3218 |
| 2019/0165059 | A1* | 5/2019 | Hou | H01L 27/12 |

FOREIGN PATENT DOCUMENTS

| | | |
|---|---|---|
| KR | 10-1427593 | 8/2014 |
| KR | 10-2015-0005264 | 1/2015 |
| KR | 10-2015-0044290 | 4/2015 |
| KR | 10-2015-0067624 | 6/2015 |
| KR | 10-2015-0089435 | 8/2015 |

\* cited by examiner

ORGANIC LIGHT-EMITTING DISPLAY APPARATUS AND METHOD OF MANUFACTURING THE SAME

CROSS-REFERENCE TO RELATED APPLICATION

This application claims priority from and the benefit of Korean Patent Application No. 10-2018-0072994, filed on Jun. 25, 2018, which is hereby incorporated by reference for all purposes as if fully set forth herein.

BACKGROUND

Field

Exemplary embodiments of the invention relate generally to an organic light-emitting display apparatus and a method of manufacturing the organic light-emitting display apparatus and, more specifically, to an organic light-emitting display apparatus improved such that a shadow occurring in deposition of an emission layer may be suppressed, and a method of manufacturing the organic light-emitting display apparatus.

Discussion of the Background

To realize colors according to the principle by which holes and electrons injected from an anode and a cathode are recombined and thus emit light, pixels each have a structure including an electroluminescent (EL) device where an emission layer is inserted between a pixel electrode that is the anode and an opposite electrode that is the cathode.

Each of the pixels may be one of a red pixel, a green pixel, and a blue pixel, and a desired color is expressed by combining three colors of the pixels. That is, each pixel has a structure in which an emission layer is interposed between two electrodes so as to emit light of one of a red color, a green color, and a blue color, and a color of one unit pixel is expressed by appropriately combining three colored lights.

The emission layer is formed via a deposition process using a mask.

However, when an emission layer of each pixel is formed via deposition using a mask, a shadow phenomenon occurs, in which the deposition material is not applied only to a desired pixel but is applied to adjacent pixels. That is, for example, when deposition is performed on a green pixel, a green source is supposed to be applied only within a region of a green pixel so as to form an emission layer, but deposition of the green source may also be applied to an adjacent red region or an adjacent blue region. Thus, a problem of a undesired color mixture may occur. This problem is generally called a shadow phenomenon. The shadow phenomenon occurs because a deposition source spreads through a gap between a pixel-defining layer and a mask for deposition, the pixel-defining layer being provided to define a region of each pixel. The shadow phenomenon is a reason by which performance and reliability of a product may deteriorate.

The above information disclosed in this Background section is only for understanding of the background of the inventive concepts, and, therefore, it may contain information that does not constitute prior art.

SUMMARY

Exemplary embodiments of the invention provide an organic light-emitting display apparatus wherein a shadow occurring in the deposition of an emission layer may be suppressed, and a method of manufacturing the organic light-emitting display apparatus.

Additional features of the inventive concepts will be set forth in the description which follows, and in part will be apparent from the description, or may be learned by practice of the inventive concepts.

According to one or more exemplary embodiments, an organic light-emitting display apparatus includes a pixel-defining layer configured to surround a plurality of pixels while exposing an emission area of the plurality of pixels on a substrate; and a spacer provided on the pixel-defining layer and configured to allow a mask to be placed on the spacer, the mask being arranged for deposition of an emission layer in the emission area, wherein a distance in a plane direction between the spacer and each of the plurality of pixels is within 1 µm.

The spacer may include a plurality of isolated bodies that are separate from each other in respective island forms in the plane direction.

Each of the plurality of spacers may be surrounded by four pixels from among the plurality of pixels.

A distance in the plane direction between the plurality of spacers may be between 1 µm and 3 µm.

A height of the pixel-defining layer may be within 3.5 µm, wherein the height is perpendicular to the plane direction and is with respect to a stack direction of the pixel-defining layer and the spacer.

A height of the spacer may be within 3.5 µm, wherein the height is perpendicular to the plane direction and is with respect to a stack direction of the pixel-defining layer and the spacer.

With respect to a stack direction of the pixel-defining layer and the spacer which is perpendicular to the plane direction, a relation of a width $W_{PDL}$ of the pixel-defining layer and a top width $T_{SPC}$ and a bottom width $B_{SPC}$ of the spacer may be set to be $[T_{SPC} \leq B_{SPC} \leq W_{PDL}]$.

A pixel electrode and an opposite electrode may be further provided in the emission area, wherein the emission layer is between the pixel electrode and the opposite electrode.

The opposite electrode may completely cover planar-exposed portions of the emission layer, the spacer, and the pixel-defining layer.

A small-step difference area where the spacer is not provided on the pixel-defining layer may be provided in a mesh shape in the plane direction.

According to one or more exemplary embodiments, a method of manufacturing an organic light-emitting display apparatus includes surrounding a plurality of pixels by using a pixel-defining layer so as to expose an emission area of the plurality of pixels on a substrate; forming a spacer on the pixel-defining layer; and depositing an emission layer in the emission area by placing a mask on the spacer, wherein a distance in a plane direction between the spacer and each of the plurality of pixels is within 1 µm.

The method may further include forming the spacer as a plurality of isolated bodies that are separate from each other in respective island forms in the plane direction.

Each of the plurality of spacers may be surrounded by four pixels from among the plurality of pixels.

A distance in the plane direction between the plurality of spacers may be between 1 µm and 3 µm.

The method may further include forming the pixel-defining layer to have a height within 3.5 µm, wherein the height is perpendicular to the plane direction and is with respect to a stack direction of the pixel-defining layer and the spacer.

The method may further include forming the spacer to have a height within 3.5 µm, wherein the height is perpendicular to the plane direction and is with respect to a stack direction of the pixel-defining layer and the spacer.

With respect to a stack direction of the pixel-defining layer and the spacer which is perpendicular to the plane direction, a relation of a width $W_{PDL}$ of the pixel-defining layer and a top width $T_{SPC}$ and a bottom width $B_{SPC}$ of the spacer may be set to be $[T_{SPC} \leq B_{SPC} \leq W_{PDL}]$.

The method may further include forming a pixel electrode and an opposite electrode in the emission area, wherein the emission layer is between the pixel electrode and the opposite electrode.

The opposite electrode may completely cover planar-exposed portions of the emission layer, the spacer, and the pixel-defining layer.

The method may further include forming a small-step difference area in a mesh shape in the plane direction, wherein the spacer is not provided on the pixel-defining layer in the small-step difference area.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
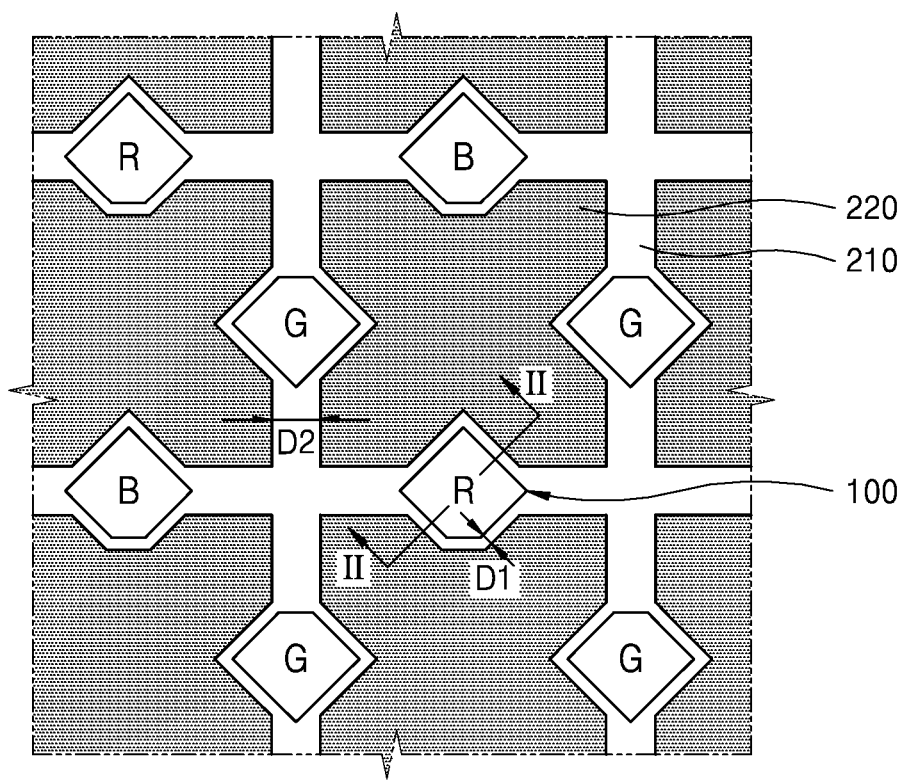
FIG. 1 is a plan view illustrating placement of pixels, a pixel-defining layer, and a spacer of an organic light-emitting display apparatus, according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
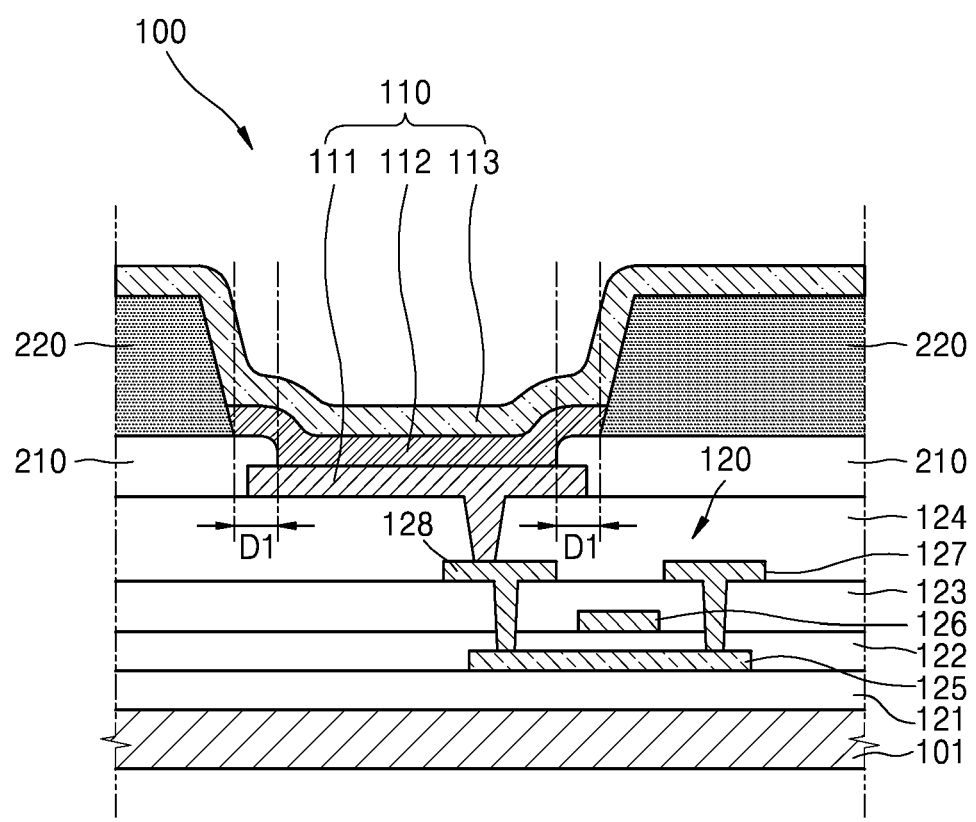
FIG. 2 is a cross-sectional view of a pixel, taken along a line II-II of FIG. 1.

FIG. 1 is a plan view illustrating placement of pixels of an organic light-emitting display apparatus, according to an exemplary embodiment. FIG. 2 is a cross-sectional view of a pixel 100, taken along a line II-II of FIG. 1.

As illustrated, a plurality of pixels 100, each having a red color R, a green color G, or a blue color B, are provided on a substrate 101 (refer to FIG. 2), a pixel-defining layer 210 surrounds each of the pixels 100, and a spacer 220 consisting of a plurality of isolated bodies that are separate from each other in respective island forms is provided between the pixels 100.

The pixel-defining layer 210 is configured to define an emission area of each pixel 100, and when an emission layer 112 of FIG. 2 is deposited on the emission area, the spacer 220 is configured to support a mask 300 (refer to FIG. 4) having a pattern hole 301 (refer to FIG. 4) corresponding to the emission layer 112.

The spacers 220 are formed with an area similar to that of the pixel-defining layer 210. That is, as illustrated in FIG. 1, viewing the placement from above, the spacers 220 occupy a large portion of areas around the pixels 100, except for a portion where the pixel-defining layer 210 is exposed in a mesh shape of intersecting horizontal and vertical lines, and one spacer 220 is surrounded by four pixels 100. The reason for doing so is because the spacers 220 can efficiently suppress a shadow phenomenon when the emission layer 112 is deposited. That is, because the spacers 220 stand in respective gaps between emission areas of the pixels 100, the spacers 220 prevent a deposition source, which has passed through the pattern hole 301 of the mask 300, from spreading to adjacent other pixels 100. To do so, a planar distance D1 between the spacer 220 and an emission area of the pixel 100 may be within 1 μm, i.e., the spacer 220 and the emission area of the pixel 100 may be very close to each other.

The mechanism will be further described below, and a cross-sectional structure of each pixel 100 including the emission layer 112 will now be described with reference to FIG. 2.

As illustrated, each pixel 100 includes a thin-film transistor 120, an electroluminescent (EL) device 110, or the like.

With respect to the thin-film transistor 120, an active layer 125 is formed on a buffer layer 121, and has source and drain regions heavily doped with N-type impurities or P-type impurities. The active layer 125 may include an oxide semiconductor. For example, the oxide semiconductor may include oxide of a material selected from metal elements of the group 12, 13, and 14 elements including zinc (Zn), indium (In), gallium (Ga), tin (Sn), cadmium (Cd), germanium (Ge), and the like. For example, the active layer 125 including the oxide semiconductor may include a G-I—Z—O layer [$(In_2O_3)_a(Ga_2O_3)_b(ZnO)_c$ layer] (where, a, b, c are real numbers that satisfy a≥0, b≥0, c>0, respectively). A gate electrode 126 is formed over the active layer 125 by having a gate insulating layer 122 interposed therebetween. A source electrode 127 and a drain electrode 128 are formed over the gate electrode 126. An interlayer insulating layer 123 is provided between the gate electrode 126 and the source and drain electrodes 127 and 128, and a passivation layer 124 is provided between a pixel electrode 111 of the EL device 110 and the source and drain electrodes 127 and 128.

The pixel-defining layer 210 and the spacer 220 are formed over the pixel electrode 111, the pixel electrode 111 is exposed by forming an opening in the pixel-defining layer 210, and then the emission layer 112 of the EL device 110 is deposited thereon.

The EL device 110 is configured to display predetermined image information by emitting red light, green light, or blue light according to a flow of current, and includes the pixel electrode 111 connected to the drain electrode 128 of the thin-film transistor 120, an opposite electrode 113 entirely covering a pixel, and the emission layer 112 emitting between the pixel electrode 111 and the opposite electrode 113.

In addition, a hole injection layer (HIL), a hole transport layer (HTL), an electron transport layer (ETL), an electron injection layer (EIL), or the like may be stacked near the emission layer 112.

The opposite electrode 113 is formed to cover planar-exposed areas of the pixel 100 and a peripheral area thereof, i.e., the opposite electrode 113 covers not only the emission area where the emission layer 112 is formed but also covers the spacer 220 and the pixel-defining layer 210.

In the above, it is described that the spacers 220 are formed with the area similar to that of the pixel-defining layer 210, and each of the spacers 220 has the island form except for a mesh-shaped area of the pixel-defining layer 210. The reason for doing so is to decrease a possibility that the opposite electrode 113 is disconnected. That is, when the spacer 220 is formed, a step difference with respect to the emission layer 112 is increased compared to a case where only the pixel-defining layer 210 is formed, such that, when the opposite electrode 113 is formed to cover the pixel 100 and all peripheral areas thereof, the opposite electrode 113 may not be completely formed on the emission layer 112 and may be disconnected. Therefore, as illustrated in FIG. 1, a small-step difference area of the pixel-defining layer 210 in a mesh shape is provided around the pixel 100, such that a possibility of disconnection of the opposite electrode 113 is decreased. To do so, a distance D2 that is a width of the small-step difference area in a mesh shape, i.e., a gap between the spacers 220 each having a separate island shape, may be at least 1 μm, and when the spacer 220 becomes small and thus the distance D2 is increased, the suppression effect with respect to the shadow phenomenon is decreased, such that the distance D2 is controlled not to exceed 3 μm. That is, the distance D2 between the spacers 220 may be from about 1 μm and to about 3 μm.

Figure 3:
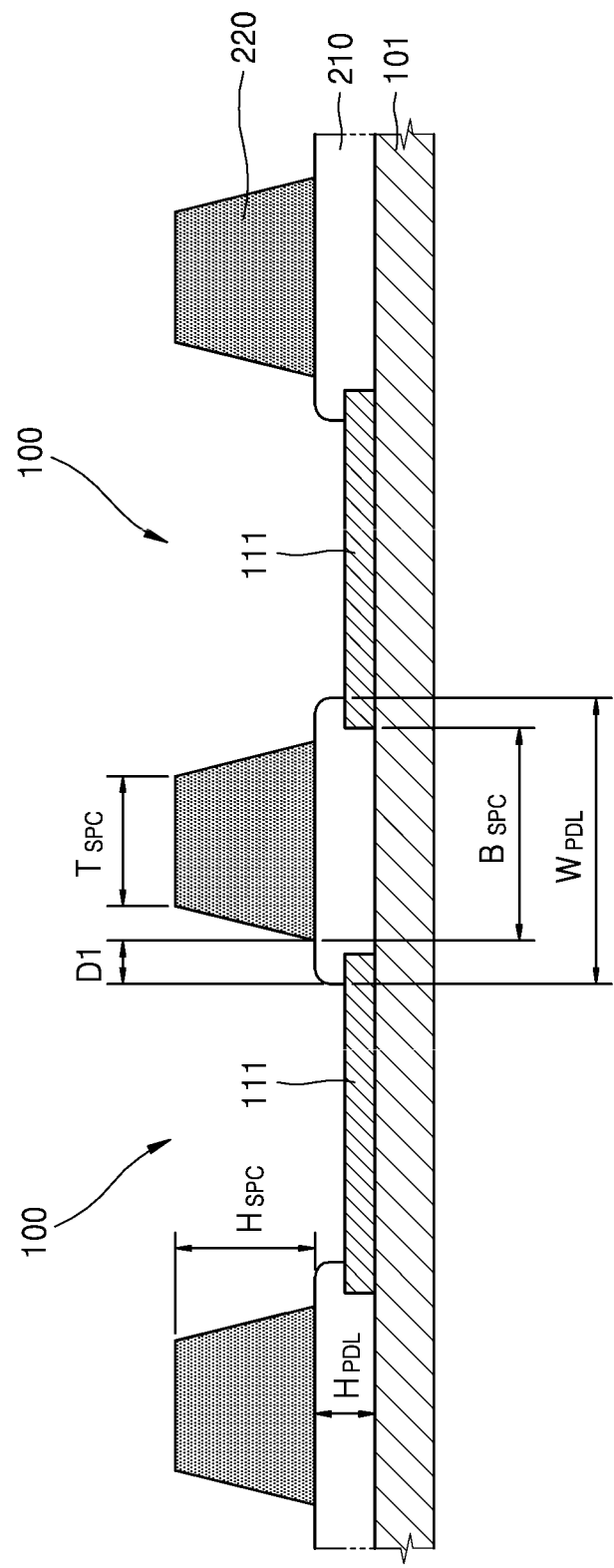
FIG. 3 illustrates a relation of heights and widths of the pixel-defining layer and the spacer by simplifying the cross-sectional view of FIG. 2.

FIG. 3 illustrates a structure of the pixel 100, the structure having been simplified by omitting the thin-film transistor 120, the emission layer 112, the opposite electrode 113, and the like of FIG. 2 so as to illustrate heights and widths of the pixel-defining layer 210 and the spacer 220, and the distance D1 with respect to the emission area where the pixel electrode 111 is exposed. It is assumed that the thin-film transistor 120 is in the substrate 101.

First, the pixel-defining layer 210 surrounds an emission area of each pixel 100 over the substrate 101, and a portion of the pixel electrode 111 which is not covered with the pixel-defining layer 210 but is exposed corresponds to the emission area. When the emission layer 112 is formed thereon, as illustrated in FIG. 2, the emission layer 112 is formed to be larger than the emission area, however, actual emission occurs at a contact area with the pixel electrode 111.

Afterward, the spacer 220 is formed on the pixel-defining layer 210, and in this regard, it is important to make the planar distance D1 be small between the spacer 220 and the emission area. By doing so, it is possible to efficiently prevent a deposition source, which has passed through the pattern hole 301, from spreading to other pixels 100 when deposition is performed by arranging the mask 300 on the spacer 220. Therefore, the planar distance D1 between the spacer 220 and the emission area may not be greater than 1 μm, and actually, the spacer 220 is very close to the emission area. By doing so, the spacer 220 may function well as a blocking wall to prevent the deposition source from spreading.

In consideration of stability of a stack structure, a relation of a width $W_{PDL}$ of the pixel-defining layer 210 and a top width $T_{SPC}$ and a bottom width $B_{SPC}$ of the spacer 220 is set to be $T_{SPC} \leq B_{SPC} \leq W_{PDL}$. That is, stability of the stack structure is achieved by having a structure narrowing from the substrate 101 to the top, and because a larger margin space is provided on the pixel-defining layer 210, the spacer 220 does not intrude into an emission area even if a position of the spacer 220 slightly deviates.

Also, the heights of the pixel-defining layer 210 and the spacer 220 are set not to exceed 3.5 μm. If the heights are too great, a possibility of disconnection of the opposite electrode 113 is increased as described above.

Figure 4:
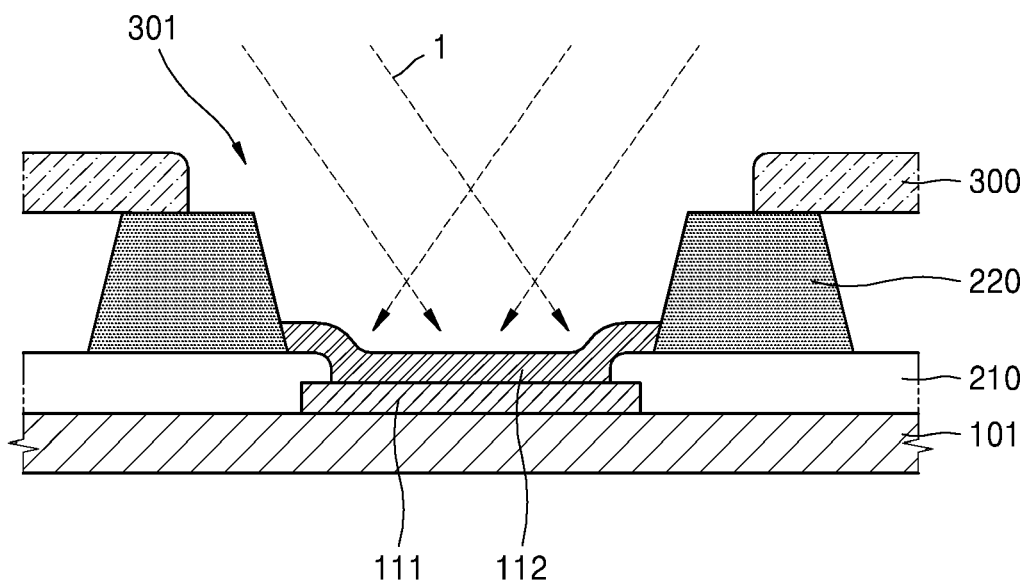
FIG. 4 is a cross-sectional view illustrating a process of placing a mask on the spacer of FIG. 3 and performing deposition of an emission layer.

Deposition of the emission layer 112 by using the mask 300 for the organic light-emitting display apparatus having the pixel-defining layer 210 and the spacer 220 with the aforementioned structure may be performed as illustrated in FIG. 4.

That is, the emission layer 112 is deposited on the emission area where the pixel electrode 111 is exposed via the opening of the pixel-defining layer 210, and in the deposition, the mask 300 is put on the spacer 220 and then is adjusted to align the pattern hole 301 with the emission area.

Afterward, a deposition source 1 is supplied. Then, the deposition source 1 that has passed through the pattern hole 301 adheres to the emission area and forms the emission layer 112.

In this regard, because the spacers 220 surround most portions of the emission area, a possibility that the deposition source 1 that has passed through the pattern hole 301 spreads to adjacent another pixel 100 is significantly decreased. That is, there is almost no space between the mask 300 and the spacer 220 being very close to the emission area, the space leading to adjacent another pixel 100, there is actually no probability that the deposition source 1 may spread to another place. Therefore, a shadow phenomenon in the deposition is suppressed such that a risk of a color mixture of the emission layer 112 is prevented.

Afterward, planar exposed portions of the emission layer 112, the pixel-defining layer 210, and the spacer 220 are covered with the opposite electrode 113 as described with reference to FIG. 2. In this regard, because the pixel-defining layer 210 without the spacer 220 is provided in a mesh shape as described above, a possibility of disconnection of the opposite electrode 113 is decreased, such that the EL device 110 is manufactured in which the pixel electrode 111 and the opposite electrode 113 stably face each other without a risk of disconnection by having the emission layer 112 arranged therebetween.

Therefore, when the structure of the pixel-defining layer 210 and the spacer 220 is used, the shadow phenomenon is sufficiently suppressed in deposition of the emission layer 112, such that a color mixture between pixels may be prevented.

Figure 5:
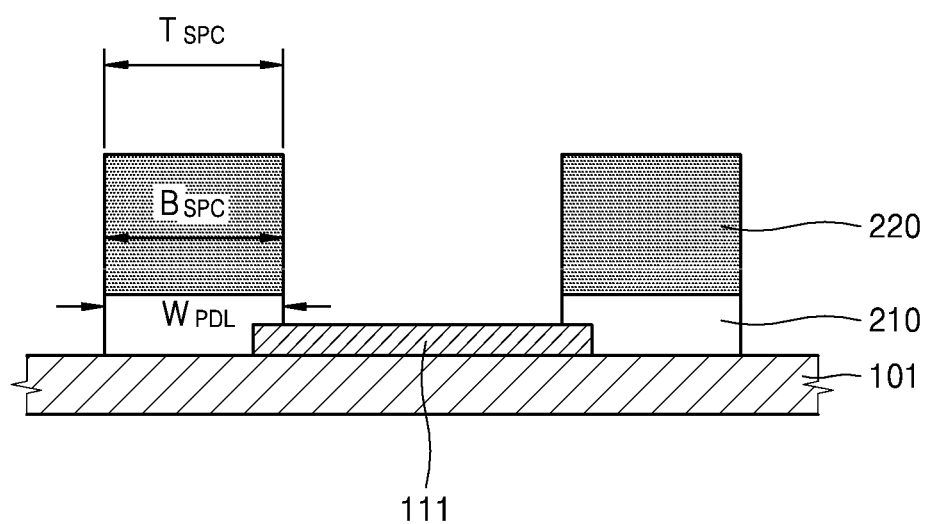
FIG. 5 is a cross-sectional view illustrating a modified structure of the pixel-defining layer and the spacer illustrated in FIG. 3.

In the aforementioned exemplary embodiment, the pixel-defining layer 210 and the spacer 220 narrow from the substrate 101, but as illustrated in FIG. 5, the width $W_{PDL}$ of the pixel-defining layer 210 and the top width $T_{SPC}$ and the bottom width $B_{SPC}$ of the spacer 220 may be set to be equal to each other. This relation is obviously included in the aforementioned relation of $T_{SPC} \leq B_{SPC} \leq W_{PDL}$, and is presented to illustrate that the relation of $T_{SPC} = B_{SPC} = W_{PDL}$ is available. That is, various modifications may be made within the scope of the inventive concepts.

As described above, according to the organic light-emitting display apparatus and the method of manufacturing the organic light-emitting display apparatus according to the exemplary embodiments, a color mixture between pixels may be prevented by suppressing the shadow phenomenon in deposition of an emission layer, therefore, performance and reliability of the organic light-emitting display apparatus may be significantly improved by using the method.

Although certain exemplary embodiments and implementations have been described herein, other embodiments and modifications will be apparent from this description.

Accordingly, the inventive concepts are not limited to such embodiments, but rather to the broader scope of the appended claims and various obvious modifications and equivalent arrangements as would be apparent to a person of ordinary skill in the art.

What is claimed is:

1. An organic light-emitting display apparatus comprising:
   a pixel-defining layer configured to surround a plurality of pixels while exposing an emission area of the plurality of pixels on a substrate; and
   a plurality of spacers disposed on the pixel-defining layer and occupying areas around the plurality of pixels except for a portion of the pixel defining layer that is exposed in a mesh shape of intersecting horizontal and vertical lines that intersect the plurality of pixels,
   wherein each spacer of the plurality of spacers comprises an isolated body that is separate from the other spacers of the plurality of spacers in a plane parallel to the substrate,
   wherein each spacer of the plurality of spacers comprises four side surfaces, each of the side surfaces comprising two planar portions formed by the mesh shape and coplanar with each other, and a concave portion disposed between the two planar portions,
   wherein each spacer of the plurality of spacers is surrounded by four adjacent pixels from among the plurality of pixels, the four adjacent pixels being partially disposed in respective ones of the concave portions,
   wherein a distance in the plane parallel to the substrate between each of the concave portions of each spacer of the plurality of spacers and a respective one of the four adjacent pixels among the plurality of pixels is within 1 μm,
   wherein, when viewed from the top of the substrate, each of the four concave portions and each of the four adjacent pixels are disposed in engagement with each other,
   wherein a height of the spacer is within 3.5 μm, and
   wherein the height is perpendicular to the plane parallel to the substrate and is with respect to a stack direction of the pixel-defining layer and each spacer of the plurality of spacers.

2. The organic light-emitting display apparatus of claim 1, wherein a distance in the plane parallel to the substrate between the plurality of spacers formed by the mesh shape is between 1 μm and 3 μm.

3. The organic light-emitting display apparatus of claim 1, wherein a height of the pixel-defining layer is within 3.5 um, wherein the height is perpendicular to the plane parallel to the substrate and is with respect to a stack direction of the pixel-defining layer and each spacer of the plurality of spacers.

4. The organic light-emitting display apparatus of claim 1, wherein, with respect to the stack direction of the pixel-defining layer and each spacer of the plurality of spacers which is perpendicular to the plane parallel to the substrate, a relation of a width $W_{PDL}$ of the pixel-defining layer and a top width $T_{SPC}$ and a bottom width $B_{SPC}$ of each spacer of the plurality of spacers is set to be $[T_{SPC} \leq B_{SPC} \leq W_{PDL}]$.

5. The organic light-emitting display apparatus of claim 1, wherein a pixel electrode and an opposite electrode are further provided in the emission area, wherein the emission layer is between the pixel electrode and the opposite electrode.

6. The organic light-emitting display apparatus of claim 5, wherein the opposite electrode completely covers planar-exposed portions of the emission layer, each spacer of the plurality of spacers, and the pixel-defining layer.

7. A method of manufacturing an organic light-emitting display apparatus, the method comprising:
   surrounding a plurality of pixels by using a pixel-defining layer so as to expose an emission area of the plurality of pixels on a substrate;
   forming a plurality of spacers on the pixel-defining layer; and
   depositing an emission layer in the emission area by placing a mask on each spacer of the plurality of spacers,
   wherein the plurality of spacers are disposed on the pixel-defining layer and occupy areas around the plurality of pixels except for a portion of the pixel defining layer that is exposed in a mesh shape of intersecting horizontal and vertical lines that intersect the plurality of pixels,
   wherein each spacer of the plurality of spacers comprises an isolated body that is separate from the other spacers of the plurality of spacers in a plane parallel to the substrate,
   wherein each spacer of the plurality of spacers comprises four side surfaces, each of the side surfaces comprising two planar portions formed by the mesh shape and coplanar with each other, and a concave portion disposed between the two planar portions,
   wherein each spacer of the plurality of spacers is surrounded by four adjacent pixels from among the plurality of pixels, the four adjacent pixels being partially disposed in respective ones of the concave portions,
   wherein a distance in the plane parallel to the substrate between each of the concave portions of each spacer of the plurality of spacers and a respective one of the four adjacent pixels among the plurality of pixels is within 1 μm,
   wherein, when viewed from the top of the substrate, each of the four concave portions and each of the four adjacent pixels are disposed in engagement with each other,
   wherein a height of the spacer is within 3.5 μm, and
   wherein the height is perpendicular to the plane parallel to the substrate and is with respect to a stack direction of the pixel-defining layer and each spacer of the plurality of spacers.

8. The method of claim 7, wherein a distance in the plane direction between the plurality of spacers is between 1 μm and 3 μm.

9. The method of claim 7, further comprising forming the pixel-defining layer to have a height within 3.5 μm, wherein the height is perpendicular to the plane parallel to the substrate and is with respect to a stack direction of the pixel-defining layer and each spacer of the plurality of spacers.

10. The method of claim 7, wherein, with respect to the stack direction of the pixel-defining layer and each spacer of the plurality of spacers which is perpendicular to the plane parallel to the substrate, wherein, with respect to the stack direction of the pixel-defining layer and each spacer of the plurality of spacers which is perpendicular to the plane parallel to the substrate, a relation of a width $W_{PDL}$ of the pixel-defining layer and a top width $T_{SPC}$ and a bottom width $B_{SPC}$ of each spacer of the plurality of spacers is set to be $[T_{SPC} \leq B_{SPC} \leq W_{PDL}]$.

11. The method of claim 7, further comprising forming a pixel electrode and an opposite electrode in the emission area, wherein the emission layer is between the pixel electrode and the opposite electrode.

12. The method of claim 11, wherein the opposite electrode completely covers planar-exposed portions of the emission layer, each spacer of the plurality of spacers, and the pixel-defining layer.

13. The method of claim 7, further comprising forming a small-step difference area in the mesh shape, wherein the plurality of spacers are not provided on the pixel-defining layer in the small-step difference area.

* * * * *